(12) United States Patent
Lin et al.

(10) Patent No.: US 12,317,451 B2
(45) Date of Patent: May 27, 2025

(54) BOILER PLATES FOR COMPUTING SYSTEMS

(71) Applicant: ZT GROUP INT'L, INC., Secaucus, NJ (US)

(72) Inventors: Ting Yu Lin, Fairfield, NJ (US); Tommy Lin, Maspeth, NY (US)

(73) Assignee: ZT Group Int'l, Inc., Secaucus, NJ (US)

( * ) Notice: Subject to any disclaimer, the term of this patent is extended or adjusted under 35 U.S.C. 154(b) by 207 days.

(21) Appl. No.: 17/929,787

(22) Filed: Sep. 6, 2022

(65) Prior Publication Data

US 2024/0081025 A1 Mar. 7, 2024

(51) Int. Cl.
*H05K 7/20* (2006.01)

(52) U.S. Cl.
CPC ..... *H05K 7/20336* (2013.01); *H05K 7/20309* (2013.01); *H05K 7/20318* (2013.01)

(58) Field of Classification Search
CPC .......... H05K 7/20336; H05K 7/20309; H05K 7/20318; H05K 7/20809; H05K 7/203; G06F 1/20
See application file for complete search history.

(56) References Cited

U.S. PATENT DOCUMENTS

| | | | | |
|---|---|---|---|---|
| 9,980,410 B1 * | 5/2018 | Wei | ...... | H01L 23/427 |
| 10,321,609 B2 * | 6/2019 | Hirai | ...... | H05K 7/20236 |
| 2005/0135061 A1 * | 6/2005 | Kiley | ...... | F28D 15/0275 |
| | | | | 257/E23.088 |
| 2005/0135062 A1 * | 6/2005 | Kiley | ...... | F28D 15/0275 |
| | | | | 257/E23.088 |
| 2007/0147006 A1 * | 6/2007 | Peng | ...... | H01L 23/427 |
| | | | | 361/709 |
| 2009/0277614 A1 * | 11/2009 | Lin | ...... | F28F 3/02 |
| | | | | 165/104.26 |
| 2010/0122795 A1 * | 5/2010 | Li | ...... | F28D 15/0275 |
| | | | | 165/185 |
| 2010/0265658 A1 * | 10/2010 | Sawai | ...... | G06F 1/20 |
| | | | | 361/694 |
| 2011/0005727 A1 * | 1/2011 | Yu | ...... | F28D 15/0275 |
| | | | | 29/890.032 |
| 2011/0315343 A1 * | 12/2011 | Campbell | ...... | H05K 7/203 |
| | | | | 165/80.3 |
| 2012/0193075 A1 * | 8/2012 | Reese | ...... | F28F 21/083 |
| | | | | 165/104.11 |
| 2013/0107458 A1 * | 5/2013 | Tong | ...... | H01L 23/427 |
| | | | | 361/700 |
| 2015/0021000 A1 * | 1/2015 | Ryoo | ...... | F28D 15/04 |
| | | | | 165/104.26 |
| 2015/0323261 A1 * | 11/2015 | Tseng | ...... | F28D 15/025 |
| | | | | 165/104.22 |
| 2017/0156240 A1 * | 6/2017 | Silvennoinen | ..... | H05K 7/20936 |
| 2019/0212073 A1 * | 7/2019 | Bouras | ...... | F28F 3/022 |

(Continued)

*Primary Examiner* — Stephen S Sul
(74) *Attorney, Agent, or Firm* — POLSINELLI PC

(57) ABSTRACT

A boiler plate is provided. The boiler plate includes a heat spreader layer operable to transfer heat from a computing component across the heat spreader layer. The heat spreader layer extends along a plane. At least one heat pipe extends from the heat spreader layer in a direction substantially perpendicular to the plane away from the computing component. The at least one heat pipe is operable to transfer the heat away from the heat spreader layer to reduce a temperature of the computing component.

17 Claims, 9 Drawing Sheets

(56) References Cited

U.S. PATENT DOCUMENTS

| | | | |
|---|---|---|---|
| 2021/0059075 A1* | 2/2021 | Mitsui | H05K 7/20418 |
| 2021/0321526 A1* | 10/2021 | Kulkarni | H05K 5/06 |
| 2022/0053634 A1* | 2/2022 | Zhou | H01L 23/427 |
| 2022/0346276 A1* | 10/2022 | Lin | H05K 7/20327 |
| 2022/0373266 A1* | 11/2022 | Zhu | F28D 15/04 |
| 2023/0003202 A1* | 1/2023 | Roberts | F03H 1/0031 |
| 2023/0341910 A1* | 10/2023 | Ramakrishnan | H05K 7/20327 |
| 2023/0345671 A1* | 10/2023 | Chen | H05K 7/20309 |
| 2023/0413484 A1* | 12/2023 | Ahn | G06F 1/1641 |

* cited by examiner

BOILER PLATES FOR COMPUTING SYSTEMS

FIELD

The present disclosure relates generally to a boiler plate operable to be installed in a computing system to cool a computing component.

BACKGROUND

Computing systems such as modular servers and/or information handling systems, often need cooling systems to lower a temperature of computing components such as central processing units (CPUs) and/or graphics processing units (GPUs). The computing components operating at temperatures above a threshold can result in performance issues and reliability concerns.

Two-phase immersion cooling is a technique where heat is dissipated from a surface of the computing component through phase change from liquid to vapor. As dielectric fluid with a low boiling temperature is heated by the computing component, the fluid undergoes phase change from liquid to vapor. As the fluid changes to vapor and is moved away from the computing component, the temperature of the computing component is lowered.

BRIEF DESCRIPTION OF THE DRAWINGS

Implementations of the present technology will now be described, by way of example only, with reference to the attached figures, wherein.

DETAILED DESCRIPTION

Figure 1A:
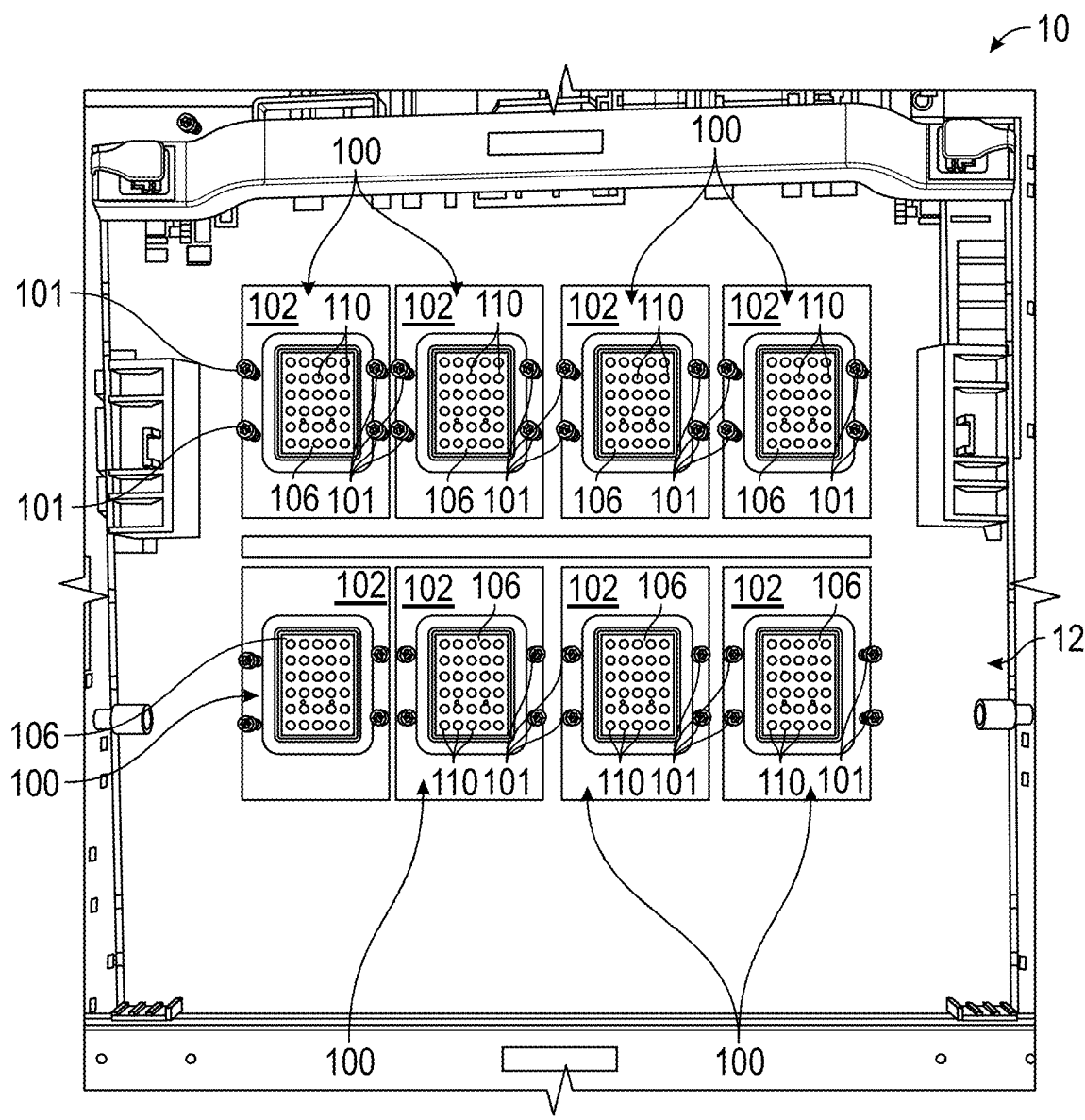
FIG. 1A is a perspective view of a computing system including a boiler plate according to the present disclosure.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

Several definitions that apply throughout this disclosure will now be presented. The term "coupled" is defined as connected, whether directly or indirectly through intervening components, and is not necessarily limited to physical connections. The term "substantially" is defined to be essentially conforming to the particular dimension, shape or other word that substantially modifies, such that the component need not be exact. For example, substantially cylindrical means that the object resembles a cylinder, but can have one or more deviations from a true cylinder. The term "about" means reasonably close to the particular value. For example, about does not require the exact measurement specified and can be reasonably close. As used herein, the word "about" can include the exact number. The term "near" as used herein is within a short distance from the particular mentioned object. The term "near" can include abutting as well as relatively small distance beyond abutting. The terms "comprising," "including" and "having" are used interchangeably in this disclosure. The terms "comprising," "including" and "having" mean to include, but not necessarily be limited to the things so described.

Disclosed herein is a boiler plate that incorporates at least one heat pipe to improve cooling of computing components (e.g., processing units) in two-phase immersion cooling. The heat pipes can extend from a heat spreader layer that is installed on top of a heat source (e.g., computing component). The heat pipes can provide additional heat transfer and nucleation area. In at least one example, the heat pipes can have boiling enhancement surfaces to further create nucleation sites. In at least one example, the heat pipes can have multiple condensation and evaporation areas for the heat pipe fluid within the heat pipes and/or multiple evaporation areas for the immersion fluid within the computing system. The heat pipes can be arranged and/or have geometries to minimize blockage for the vapor bubbles rising from other heat pipes and/or the heat spreader layer.

Figure 1B:
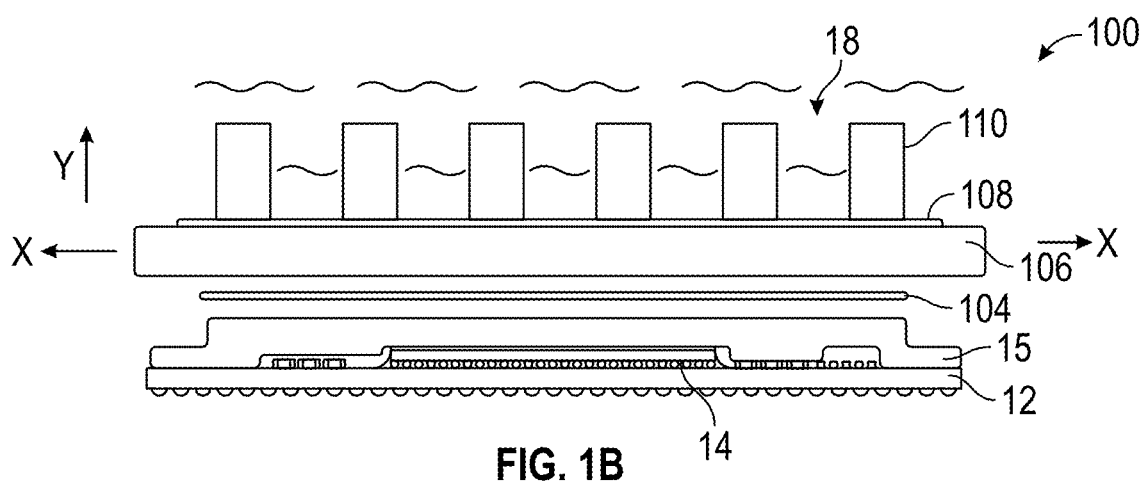
FIG. 1B is a side view of a portion of the computing system of FIG. 1A.

The disclosure now turns to FIGS. 1A and 1B, which illustrate an example of a computing system 10 to be used, for example, in a modular server and/or information handling system. The computing system 10 can include a plurality of computing components such as any combination of one or more motherboards 12, one or more hard drives, one or more risers, and/or one or more processing units 14. The processing units 14 can include central processing units (CPUs) and/or graphics processing units (GPUs). Additional components can be disposed within the computing system 10 without deviating from the scope of the disclosure. In at least one example, as illustrated in FIG. 1A, the computing system 10 can include a plurality of processing units 16. In at least one example, as illustrated in FIG. 1B, the computing system 10 can include only one processing unit 14. The processing units 16 can be coupled with the motherboard 12.

In at least one example, the computing system 10 can include one or more boiler plates 100 to cool the corresponding computing components that need cooling, such as the processing unit(s) 14. While the disclosure discusses utilizing the boiler plates 100 to cool processing units 14, the boiler plates 100 can be utilized to cool any computing components that typically need cooling. In at least one example, as illustrated in FIGS. 1A and 1B, the boiler plates 100 can be disposed on top of the processing units 14. The boiler plates 100 can be in direct contact with the processing units 14. As will be discussed in more detail below, at least one heat pipe 110 can be in direct contact with the processing unit 14 in configurations where the heat pipe 110 is exposed at the bottom of a heat spreader layer 106 of the boiler plate 100. In at least one example, as illustrated in FIG. 1A, the boiler plates 100 can be coupled with the processing unit 14, the motherboard 12, and/or any other component of the computing system 10 via fasteners 101 (e.g., screws). The boiler plates 100 can be operable to absorb heat from the processing units 14 and dissipate the heat to immersion fluid 18 such as dielectric fluid with a low boiling temperature. Accordingly, the computing system 10 can utilize two-phase immersion cooling to manage the temperatures of the computing components.

Thermal management of computing systems 10 can be critical to the performance and time between failures for the computing system 10. As computing systems 10 such as modular servers and/or information handling systems can have higher temperature environments, air cooling can be insufficient to adequately cool down the computing systems 10. In some examples, increasingly higher computing component temperature design and power, and lower temperature specifications can contribute to thermal challenges. Accordingly, the computing system 10 utilizes immersion fluid 18 to efficiently lower the temperature of the components of the computing system 10 to within a desired threshold.

In two-phase immersion cooling, heat is dissipated from the surface of the computing component through phase change from liquid to vapor. The computing components such as the processing units 14 and/or the boiler plates 100 can be immersed in the immersion fluid 18. Heat dissipated from the computing components and/or the boiler plates 100 can heat the immersion fluid 18 until the immersion fluid 18 undergoes phase change from liquid to vapor. Vapor bubbles emerging from the boiler plates 100 can carry the heat to the surface of the immersion fluid 18 via buoyancy. The vapor then can condense upon cooling and revert back to liquid form and return to the immersion fluid 18.

As illustrated in FIG. 1B, the processing unit 14 can be coupled with the motherboard 12. A lid 15 can be provided to shield the processing unit 14. The processing unit 14 can be disposed between the motherboard 12 and the lid 15. The boiler plate 100 can be positioned above the processing unit 14 opposite the motherboard 12. The boiler plate 100 can be mounted on top of the computing component between the immersion fluid 18 and the computing component. The boiler plate 100 can enhance boiling (e.g., transition from liquid to vapor) of the immersion fluid 18. The boiler plate 100 can decrease wall superheat (e.g., a temperature difference between the surface of the computing component and the saturation temperature). In at least one example, boiler plates 100 can be necessary to cool computing components with high heat fluxes.

Figure 2A:
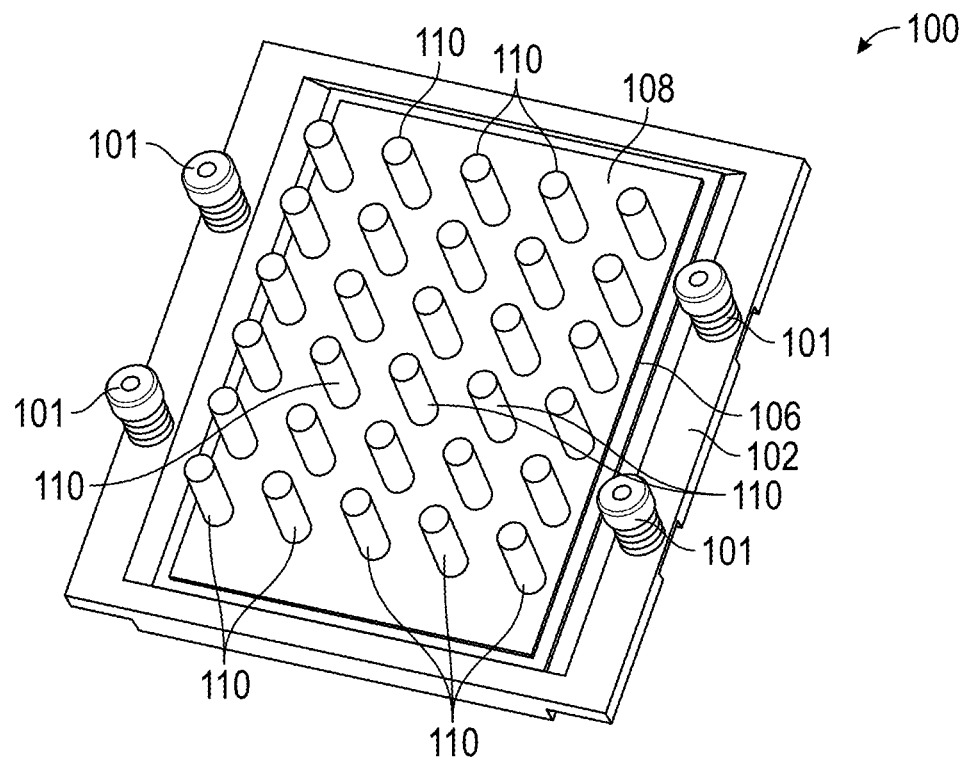
FIG. 2A is a perspective view of the boiler plate.
Figure 2B:
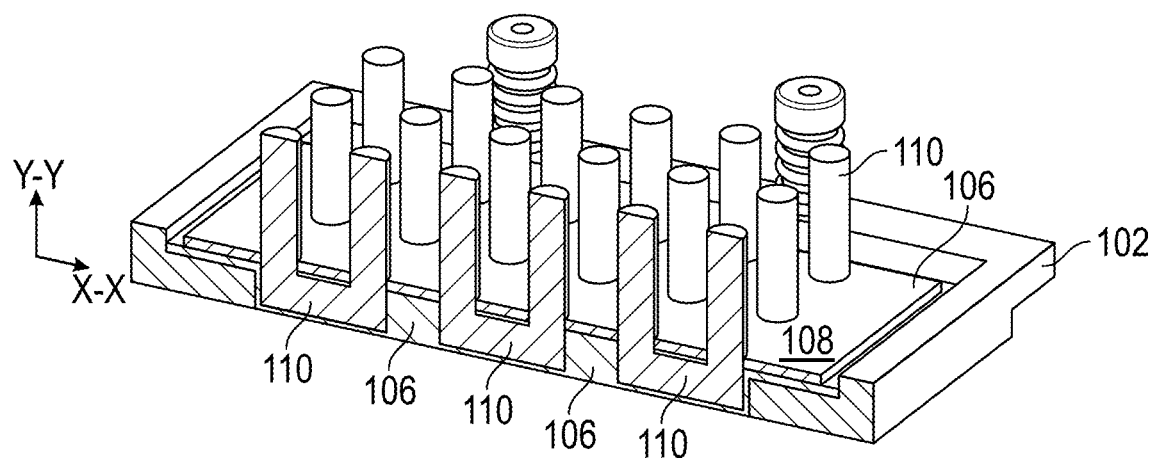
FIG. 2B is a perspective, cross-sectional view of the boiler plate of FIG. 2A.

Referring to FIGS. 1B, 2A, and 2B, the boiler plate 100 can include a mounting apparatus 102, a heat spreader layer 106, and at least one heat pipe 110 extending from the heat spreader layer 106. In at least one example, a thermal interface material 104 can be positioned between the heat spreader layer 106 and the processing unit 14. In some examples, the thermal interface material 104 can be positioned between the heat spreader layer 106 and the lid 15. In at least one example, the mounting apparatus 102 can be operable to couple the boiler plate 100 with the computing system 10, for example the motherboard 12.

The heat spreader layer 106 can be operable to transfer heat from the computing component such as the processing unit 14 across the heat spreader layer 106 (e.g., towards the immersion fluid 18). The heat spreader layer 106 can extend along a plane X-X. The plane X-X can be along a similar plane as the computing component (e.g., the processing unit 14). In some examples, the plane X-X can be vertical, for example perpendicular to the motherboard. In some examples, the plane X-X can be horizontal, for example parallel to the motherboard. In at least one example, the heat spreader layer 106 can include a boiling enhancement surface 108 which is in contact with the immersion fluid 18. The boiling enhancement surface 108 can create nucleation sites to promote latent heat flux and the boiling of the immersion fluid 18.

The at least one heat pipe 110 extends from the heat spreader layer 106 in a direction Y substantially perpendicular to the plane X-X away from the computing component (e.g., processing unit 14). The heat pipe 110 can extend from the heat spreader layer 106 into the immersion fluid 18. The heat pipe 110 is operable to transfer the heat away from the heat spreader layer 106 to reduce the temperature of the computing component. As illustrated in FIG. 2B, the heat pipe(s) 110 can be embedded in the heat spreader layer 106. In some examples, the heat pipe(s) 110 can be coupled with the heat spreader layer 106. In some examples, the heat pipe(s) 110 can be received in a groove or recess formed in the heat spreader layer 106. By having the heat pipes 110 as close to the computing component (e.g., processing unit 14) as possible, the heat pipes 110 can further improve cooling of the computing component instead of solely relying on the transfer of heat through the heat spreader layer 106. In some examples, the heat pipes 110 can be in direct contact with the computing component. In some examples, the heat pipe(s) 110 can be received on the surface of the heat spreader layer 106. The heat pipes 110 can be in direct contact with the heat spreader layer 106 to assist in removing heat away from the heat spreader layer 106 and the processing unit 14.

During cooling, the immersion fluid 18 on the heat spreader layer 106 and the heat pipes 110 evaporates after the liquid temperature is heated to its boiling point. The vapor bubbles emerge from the heat spreader layer 106 and the heat pipes 110 and detach from the boiler plate 100 (e.g., the heat spreader layer 106 and heat pipe(s) 110) and carry the heat away towards the surface of the immersion fluid 18. The vapor bubbles can emerge from the boiling enhancement surfaces (discussed in more detail below for FIGS. 5A-5E) on the heat spreader layer 106 and the heat pipes 110.

The heat pipes 110 can serve as additional heat transfer and nucleation area in addition to the heat spreader layer 106. In at least one example, the heat pipes 110 can provide multiple condensation and evaporation areas for the immersion fluid 18. For example, a conventional boiler plate without heat pipes may have a base heat transfer area of 30.25 cm². By adding a boiling enhancement surface to the conventional boiler plate, the heat transfer area can increase by 19.7% to 36.21 cm². However, the addition of heat pipes 110 (e.g., 30 heat pipes 110 with a diameter of 4 millimeter and a height extending from the heat spreader layer 106 of 13 mm), the heat transfer area can increase by 343.7% to 134.22 cm². As different sizes and shapes of heat pipes 110 are utilized, the heat transfer area can change. However, it is evident that the addition of heat pipes 110 can greatly increase the heat transfer area and drastically improve the cooling of the computing component (e.g., processing unit 14).

Figure 3:
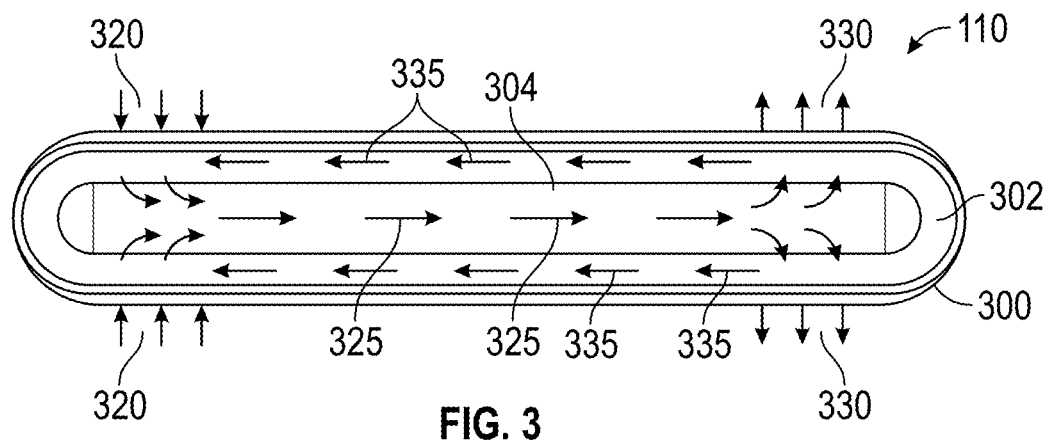
FIG. 3 is a diagram of a heat pipe.

FIG. 3 illustrates a cross-sectional diagrammatic view of a heat pipe 110. The heat pipe 110 can include a surface portion 300, a porous section 302, and a central portion 304. Heat pipes 110 conduct heat through two-phase heat transfer. Heat can be received from a heat source (e.g., computing component and/or heat spreader layer 106) at the evaporation section 320 of the heat pipe 110. The working fluid in the evaporation section 320 can vaporize due to the heat intake, and the vapor 325 flows out of the porous section 302 into and through the central portion 304 towards the condensation section 330. The condensation section 330 can be a portion of the heat pipe 110 that is away from the heat source. At the condensation section 330, the heat transfers out of the heat pipe 110, and the vapor condenses back to liquid 335 after the heat is dissipated. The liquid 335 returns to the evaporation section 320 due to capillary action in the porous section 302.

Figure 4:
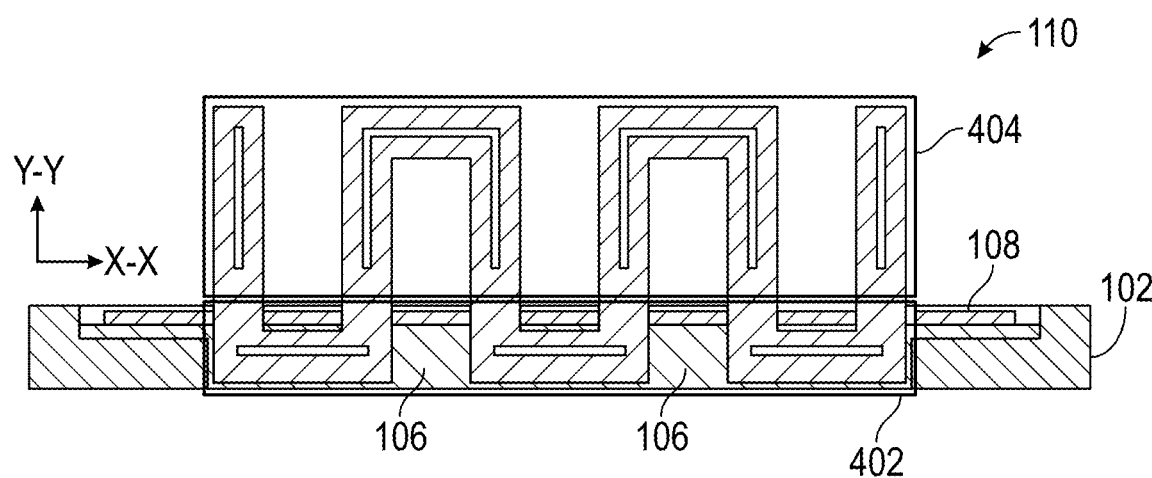
FIG. 4 is a cross-sectional view of the boiler plate.

FIG. 4 illustrates the evaporation section 402 and the condensation section 404 of the heat pipe(s) 110 in the boiler plate 100. The evaporation section 402 can be in contact with and/or received in the heat spreader layer 106. For example, the evaporation section 402 can be embedded in the heat spreader layer 106 and/or the evaporation section 402 can be coupled with the heat spreader layer 106. Accordingly, the evaporation section 402 is receiving heat (directly and/or indirectly) from the computing component (e.g., processing unit 14). In at least one example, at least a portion of the evaporation section 402 of the heat pipe(s) 110 can be oriented along the plane X-X, as the heat spreader layer 106. At the evaporation section 402, the working fluid for the heat pipe 110 vaporizes after being heated and moves towards the condensation section 404. The condensation section 404 extends away from the heat spreader layer 106 such that the heat pipe(s) 110 begin the process of dissipating the heat in the condensation section 404. At the condensation section 404, the working fluid for the heat pipe 110 condenses back to liquid after dissipating the heat, and the liquid returns to the evaporation section 402. As illustrated in FIG. 4, the boiler plate 100 can include one or more heat pipes 110 to provide a plurality of evaporation sections 402 and a plurality of condensation sections 404. Accordingly, the heat pipe(s) 110 provide increased heat transfer area to improve cooling of the computing component (e.g., processing unit 14).

Figure 5A:
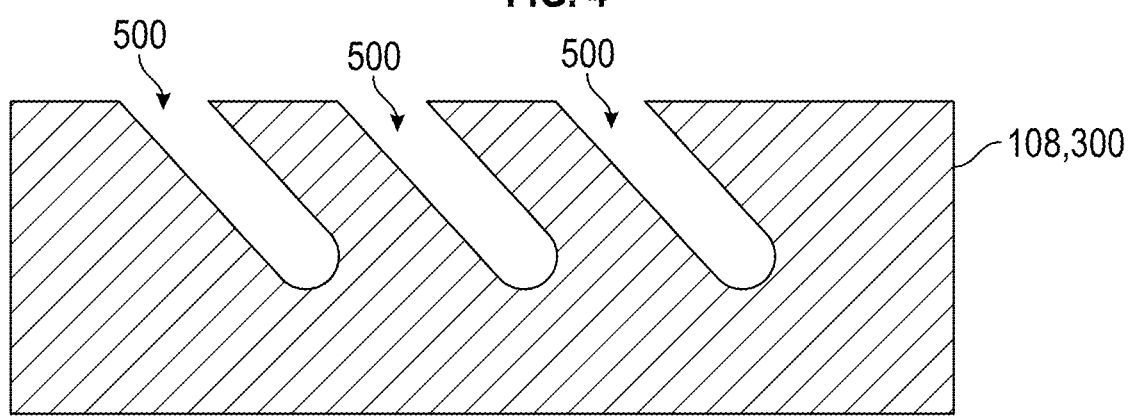
FIG. 5A is a cross-sectional view of a surface of the heat pipe with microchannels.

As illustrated in FIG. 5A, the heat pipe(s) 110 and/or the heat spreader layer 106 can include a boiling enhancement surface 108, 300. The boiling enhancement surfaces 108, 300 can increase nucleation site density, increase heat transfer coefficient, and/or decrease wall superheat. With conventional boiler plates, high heat flux can create a vapor film layer that acts as an insulator to form on the computing component's surface when the critical heat flux is exceeded.

Figure 5B:
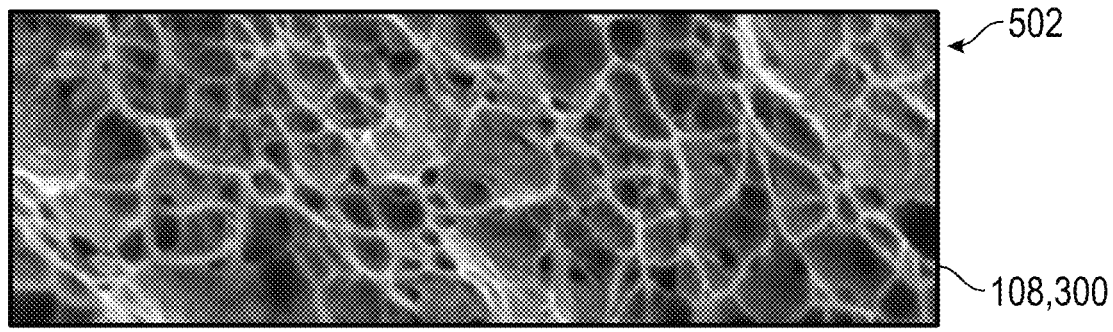
FIG. 5B is a diagram of a surface of the heat pipe with dimples.
Figure 5C:
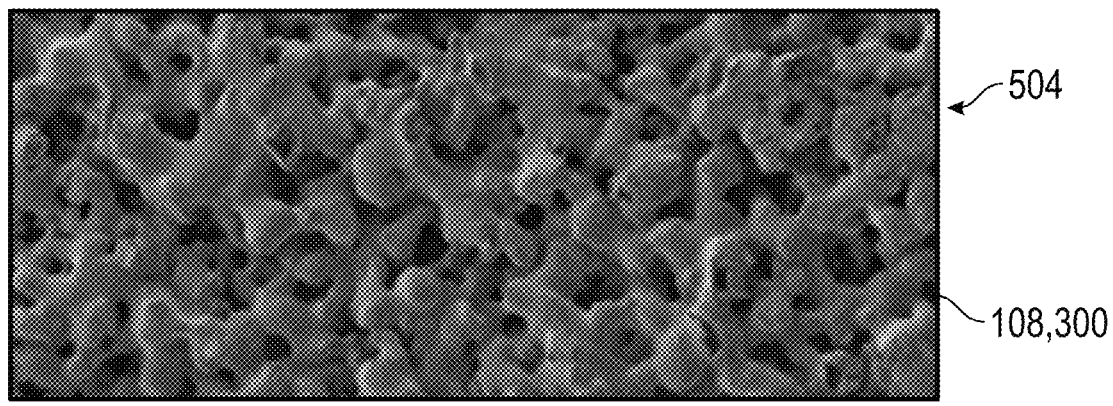
FIG. 5C is a diagram of a surface of the heat pipe with rough surfaces.
Figure 5D:
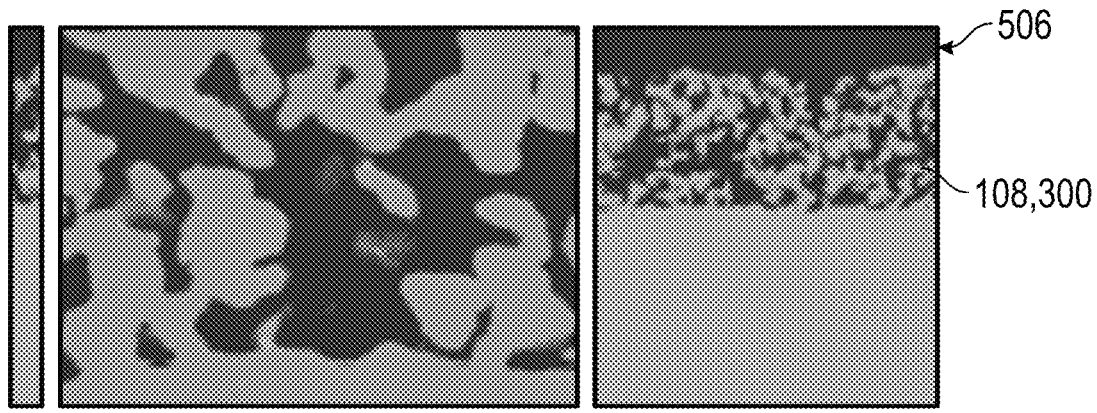
FIG. 5D is a diagram of a surface of the heat pipe with microporous coating.

FIGS. 5A-5D illustrate examples of boiling enhancement surfaces 108, 300. Other boiling enhancement surfaces 108, 300 can be contemplated without deviating from the scope of the disclosure. As illustrated in FIG. 5A, the boiling enhancement surface 108, 300 can include microchannels 500. As illustrated in FIG. 5B, the boiling enhancement surface 108, 300 can include dimples 502. As illustrated in FIG. 5D, the boiling enhancement surface 108, 300 can include rough surfaces. As illustrated in FIG. 5D, the boiling enhancement surface 108, 300 can include microporous coating.

Figure 5E:
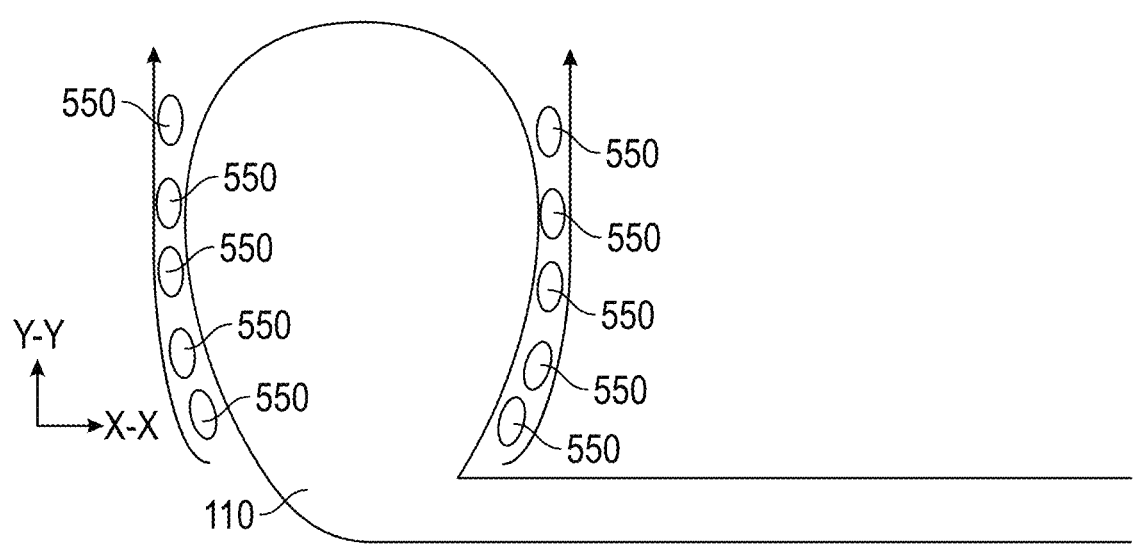
FIG. 5E is a diagram of the heat pipe generating and detaching bubbles.

As illustrated in FIG. 5E, the boiling enhancement surface 108, 300 can create active cavities which can be operable to generate and detach bubbles 550 for the immersion fluid 18. By generating and detaching bubbles quickly, more heat is taken away at a quicker pace. The bubbles 550 can be formed and move along the heat pipe 110 in the immersion fluid 18 in the direction Y away from the heat spreader layer 106 and/or the computing component. The bubbles 550 can act on each other to mimic forced convection blowing.

As illustrated in FIGS. 6-10D, each of the heat pipes 110 can form one or more geometries. In some examples, each of the condensation sections 404 can form one or more geometries. While FIGS. 6-10D illustrate multiple variations of geometries, any combination of geometries can be utilized in a boiler plate 100 without deviating from the scope of the disclosure. The geometries can vary depending on heat flux, power, power distribution, configuration of computing components, etc. Non-uniform geometry and structure of the heat pipe(s) 110 can increase boiling heat transfer area and nucleation sites.

In at least one example, the height of the condensation sections 404 extending from the heat spreader layer 106 must be controlled. If the condensation section 404 is too long, the bottom vapor evaporates and moves to the top. However, if there is too much vapor, the cooling effects are diminished or at least not improving. Additionally, the condensation section 404 that is too long may cause issues in fit within the computing system 10. However, if the condensation section 404 is too short, there may not be enough separation from the evaporation section 402, and the vapor may not cool enough to return to liquid.

Figure 6:
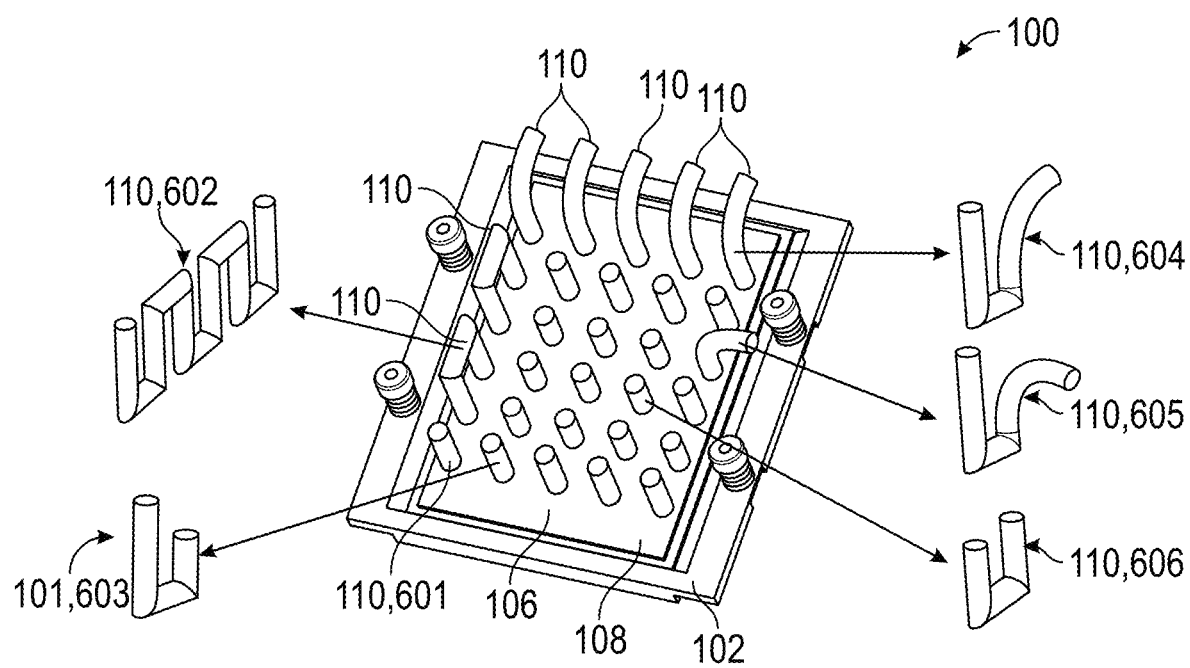
FIG. 6 is a perspective view of a boiler plate with heat pipes having different geometries.
Figure 7:
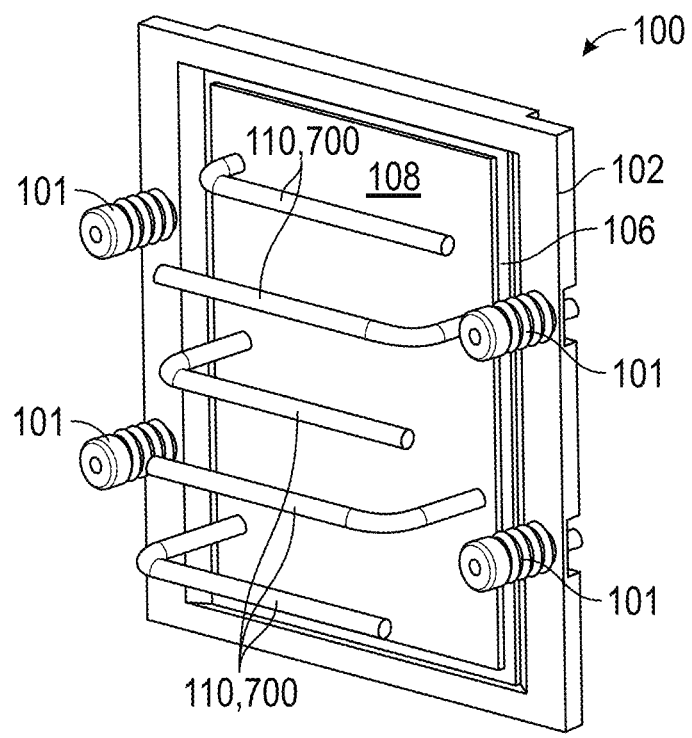
FIG. 7 is a perspective view of a boiler plate with heat pipes having another geometry.

As illustrated in FIG. 6, any combination of geometries of heat pipes 110 can be utilized in the boiler plate 100. The heat pipe 602 illustrates an example of one continuous heat pipe 110 that snakes into and out of the heat spreader layer 106 to provide a plurality of evaporation sections 402 and condensation sections 404. The heat pipe 603 illustrates an example where the heights of the condensation sections 404 can be different (e.g., one is longer and one is shorter). The condensation sections 404 of the heat pipe 603 are linear. The heat pipes 604, 605 illustrate examples where the condensation section 404 of the heat pipe is curved and/or bent in varying amounts. Also, the heat pipes 604, 605 has one condensation section 404 linear while one is curved and/or bent. FIG. 7 illustrates an example of heat pipes 700 that extend from the heat spreader layer 106 a distance and then bends to be substantially parallel to the plane X-X of the heat spreader layer 106. Having a curved and/or bent heat pipe 604, 605 can save space within the computing system 10 while providing distance from the evaporation section 402. Referring back to FIG. 6, the heat pipe 606 illustrates an example where the heights of the condensation sections 404 can be the same. The condensation sections 404 of the heat pipe 606 are linear.

While FIGS. 6 and 7 illustrate utilizing a plurality of heat pipes 110 in the boiler plate 100, having too many heat pipes 110 can cause cooling issues. For example, if there are too many heat pipes 110, there may be less places for the bubbles to flow away from the boiler plate 100, and less liquid will be available to cool and/or evaporate.

Figure 8A:
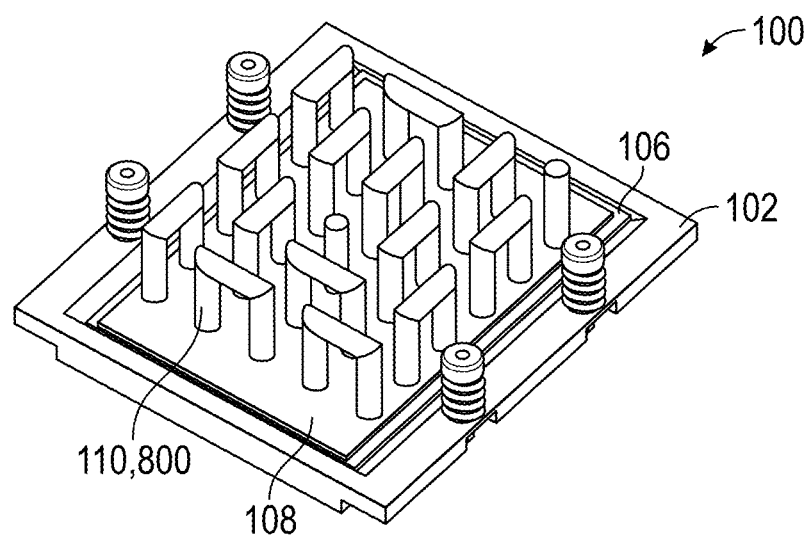
FIG. 8A is a perspective view of a boiler plate.
Figure 8B:
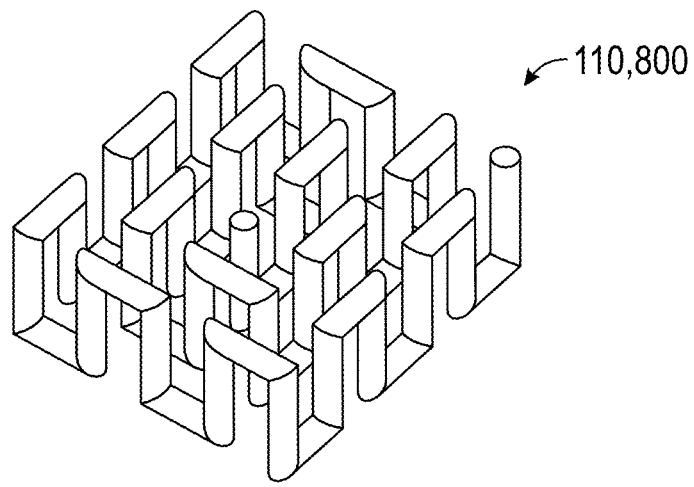
FIG. 8B is a perspective view of the heat pipe from the boiler plate of FIG. 8A.

FIGS. 8A and 8B illustrate an example of a heat pipe 800 similar to the heat pipe 602 of FIG. 6, but where one single snaking heat pipe 800 traverses throughout the boiler plate 100. A single long heat pipe 800 can be significantly cheaper to manufacture than multiple heat pipes 110 with an equivalent total length and/or area.

Figure 8C:
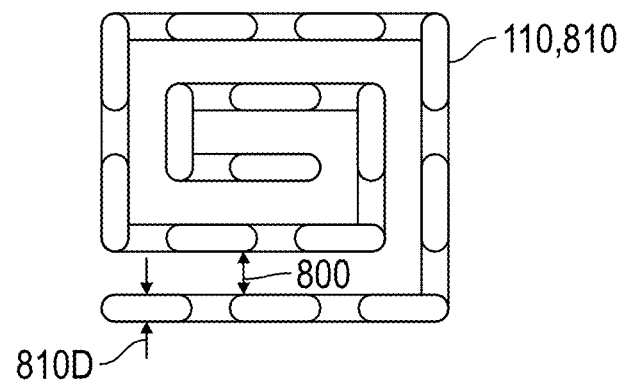
FIG. 8C is a top view of the heat pipe of FIG. 8B.
Figure 8D:
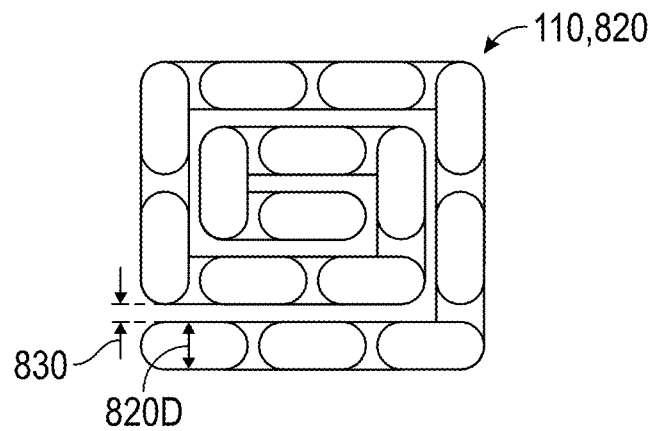
FIG. 8D is a top view of another example of the heat pipe of FIG. 8B but with a larger diameter.

FIGS. 8C and 8D illustrate that the diameters 810D, 820D and/or the spacing 800, 830 between the heat pipe(s) 110 can vary to maximize heat transfer area. In at least one example, the coiling and/or positioning of the heat pipe(s) 110 can be adjusted to minimize the space 800 between heat pipe(s) 110 to maximize heat transfer area. In at least one example, the diameter 810D, 820D of the heat pipe(s) 110 can be adjusted to maximize heat transfer area. The heat pipes 110 can be adjusted to cover more space in the heat spreader layer 106. For example, the diameter 810D of the heat pipe 810 of FIG. 8C is smaller than the diameter 820D of the heat pipe 820 of FIG. 8D. Accordingly, the spacing 830 in FIG. 8D is smaller than the spacing 800 of FIG. 8C. However, having too little space 800, 830 can cause cooling issues. For example, if there is too little space 800, 830, there may be less places for the bubbles to flow away from the boiler plate 100, and less liquid will be available to cool and/or evaporate.

FIGS. 9A-10D illustrate examples of heat pipes 110 that maximize the evaporation section 402 of the heat pipe 110 to receive as much heat as possible.

Figure 9A:
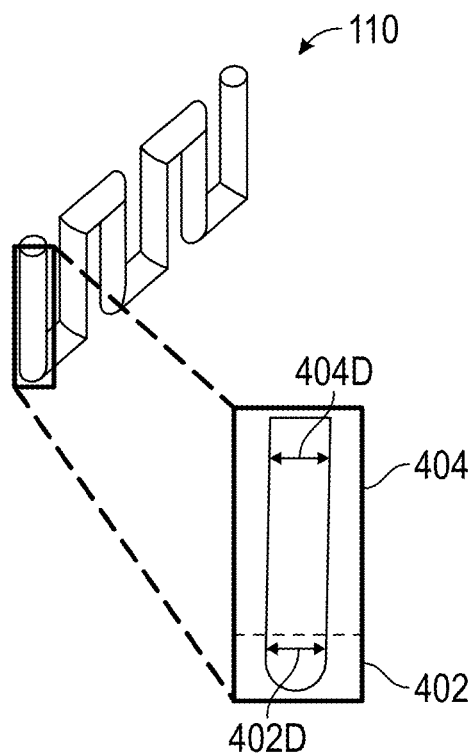
FIG. 9A is a diagram of a heat pipe having a uniform diameter.

FIG. 9A illustrates a heat pipe 110 where the evaporation section 402 has a diameter 402D that is equal to a diameter 404D of the condensation section 404. Accordingly, the heat pipe 110 can consist of one uniform diameter.

Figure 9B:
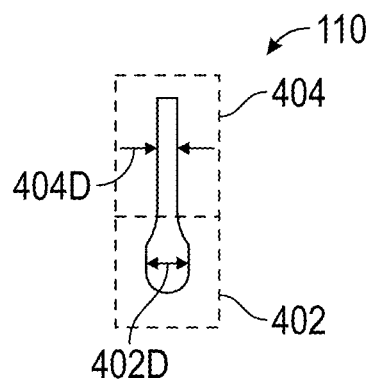
FIG. 9B is a diagram of a heat pipe having a wider diameter in an evaporation section than a condensation section.

FIG. 9B illustrates a heat pipe 110 where a diameter 402D of the evaporation section 402 is greater than a diameter 404D of the condensation section 404. With this geometry, the evaporation section 402 is maximized to cover more of the heat spreader layer 106 and receive more heat while the condensation section 404 with a smaller diameter 404D creates more space for rising vapor.

Figure 10A:
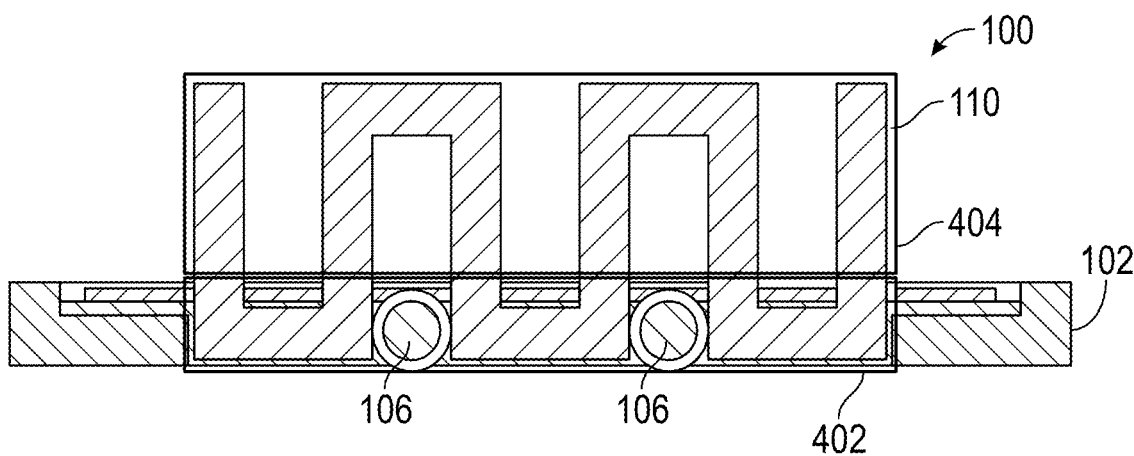
FIG. 10A is a cross-sectional view of a boiler plate.
Figure 10B:
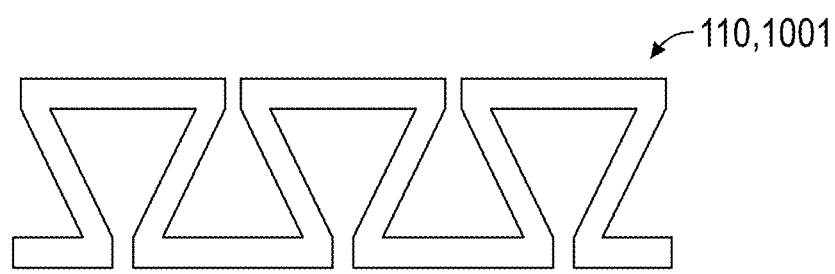
FIG. 10B is a diagram of a heat pipe having a triangular geometry.
Figure 10C:
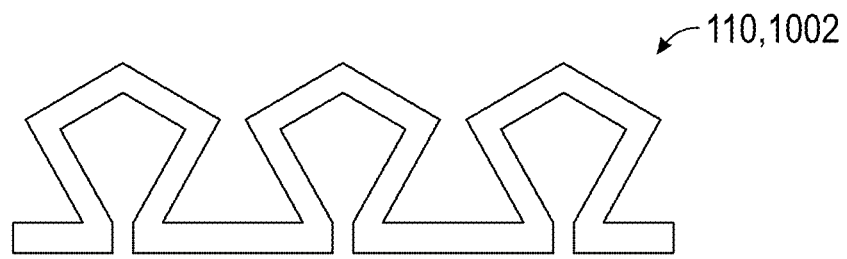
FIG. 10C is a diagram of a heat pipe having a diamond-shaped geometry.
Figure 10D:
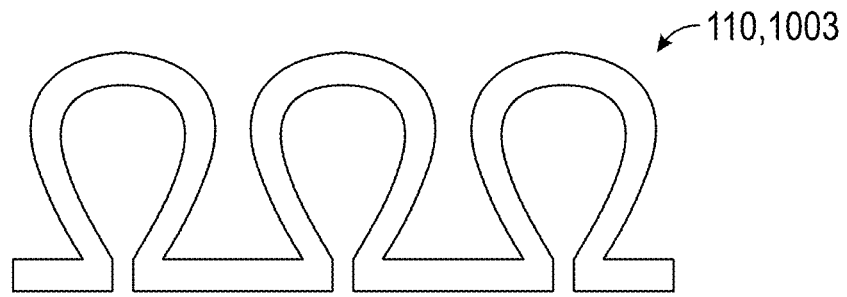
FIG. 10D is a diagram of a heat pipe having an ohm shaped geometry.

FIG. 10A illustrates how the evaporation section 402 can cover the heat spreader layer 106. By maximizing the coverage of the heat spreader layer 106 with the evaporation section 402, greater heat can be received and dissipated by the heat pipe(s) 110. FIG. 10A illustrates the heat pipe 110 where the condensation section 404 is rectangular. FIGS. 10B-10D illustrate examples of geometries of the heat pipe 110 which can maximize the evaporation section 402 to cover the heat spreader layer 106. As illustrated in FIG. 10B, the geometry of the condensation section 404 of the heat pipe 1001 can include a triangular geometry. As illustrated in FIG. 10C, the geometry of the condensation section 404 of the heat pipe 1002 can include a diamond shaped geometry. As illustrated in FIG. 10D, the geometry of the condensation section 404 of the heat pipe 1003 can include an ohm shaped geometry.

Accordingly, as illustrated in FIGS. 6-10D, each of the geometries includes at least one of the following: linear, curved, rectangular, triangular, diamond-shaped, and/or ohm shaped.

The embodiments shown and described above are only examples. Even though numerous characteristics and advantages of the present technology have been set forth in the foregoing description, together with details of the structure and function of the present disclosure, the disclosure is illustrative only, and changes may be made in the detail, especially in matters of shape, size and arrangement of the parts within the principles of the present disclosure to the full extent indicated by the broad general meaning of the terms used in the attached claims. It will therefore be appreciated that the embodiments described above may be modified within the scope of the appended claims.

What is claimed is:

1. A boiler plate comprising:
a heat spreader layer having a surface and a depth below the surface, the heat spreader layer operable to transfer heat from a computing component across the heat spreader layer, wherein the heat spreader layer extends along a plane;
at least one heat pipe operable to transfer the heat away from the heat spreader layer to reduce a temperature of the computing component, the at least one heat pipe including a snaking heat pipe,
wherein the snaking heat pipe includes a plurality of evaporation sections and a plurality of condensation sections,
wherein each of the plurality of evaporation sections is embedded in the depth of the heat spreader layer and each of the plurality of condensation sections extends away from the heat spreader layer in a direction substantially perpendicular to the plane away from the computing component such that at least part of each condensation section of the plurality of condensation sections directly contacts an immersion fluid,
wherein the snaking heat pipe has in a snaking arrangement which includes a first condensation section of the plurality of condensation sections extending away from the heat spreader layer and then back towards the heat spreader layer into a subsequent evaporation section of the plurality of evaporation sections.

2. The boiler plate of claim 1, wherein each of the plurality of evaporation sections is coupled with the heat spreader layer.

3. The boiler plate of claim 1, wherein each of the plurality of condensation sections forms one or more geometries.

4. The boiler plate of claim 3, wherein each of the one or more geometries includes at least one of the following: linear, curved, rectangular, triangular, diamond shaped, and/or ohm shaped.

5. The boiler plate of claim 1, wherein a diameter of the plurality of evaporation sections is greater than a diameter of the plurality of condensation sections.

6. The boiler plate of claim 1, wherein the at least one heat pipe consists of one continuous heat pipe traversing through the heat spreader layer.

7. The boiler plate of claim 1, wherein the at least one heat pipe includes a plurality of individual heat pipes received in the heat spreader layer.

8. The boiler plate of claim 1, wherein each of the at least one heat pipe includes a boiling enhancement surface operable to generate and detach bubbles.

9. The boiler plate of claim 8, wherein the boiling enhancement surface includes at least one of the following: microchannels, dimples, microporous coating, and/or rough surfaces.

10. A computing system comprising:
a computing component; and
a boiler plate mounted on the computing component, the boiler plate comprising:
  a heat spreader layer operable to transfer heat from the computing component across the heat spreader layer, wherein the heat spreader layer extends along a plane;
  at least one heat pipe operable to transfer the heat away from the heat spreader layer to reduce a temperature of the computing component, the at least one heat pipe including a snaking heat pipe,
wherein the snaking heat pipe includes a plurality of evaporation sections and a plurality of condensation sections,
wherein each of the plurality of evaporation sections is embedded in a depth of the heat spreader layer and each of the plurality of condensation sections extends away from the heat spreader layer in a direction substantially perpendicular to the plane away from the computing component such that at least part of each condensation section of the plurality of condensation sections directly contacts an immersion fluid,
wherein the snaking heat pipe has in a snaking arrangement which includes a first condensation section of the plurality of condensation sections extending away from the heat spreader layer and then back towards the heat spreader layer into a subsequent evaporation section of the plurality of evaporation sections.

11. The computing system of claim 10, wherein each of the plurality of evaporation sections is coupled with the heat spreader layer.

12. The computing system of claim 10, wherein each of the plurality of condensation sections forms one or more geometries, wherein each of the one or more geometries includes at least one of the following: linear, curved, rectangular, triangular, diamond shaped, and/or ohm shaped.

13. The computing system of claim 10, wherein a diameter of the plurality of evaporation sections is greater than a diameter of the plurality of condensation sections.

14. The computing system of claim 10, wherein the at least one heat pipe consists of one continuous heat pipe traversing through the heat spreader layer.

15. The computing system of claim 10, wherein the at least one heat pipe includes a plurality of individual heat pipes received in the heat spreader layer.

16. The computing system of claim 10, wherein each of the at least one heat pipe includes a boiling enhancement surface operable to generate and detach bubbles, wherein the boiling enhancement surface includes at least one of the following: microchannels, dimples, microporous coating, and/or rough surfaces.

17. The computing system of claim 10, wherein the computing component includes a central processing unit and/or a graphics processing unit.

* * * * *